US011075772B2

(12) United States Patent
Erdmann et al.

(10) Patent No.: US 11,075,772 B2
(45) Date of Patent: Jul. 27, 2021

(54) SUPPORTING THE COMMISSIONING OF A NETWORKED POWER DISTRIBUTION SYSTEM

(71) Applicant: SIGNIFY HOLDING B.V., Eindhoven (NL)

(72) Inventors: Bozena Erdmann, Aachen (DE); Matthias Wendt, Würselen (DE); Michael Alex Van Hartskamp, Eindhoven (NL); Willem Franke Pasveer, Dordrecht (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 55 days.

(21) Appl. No.: 15/741,319

(22) PCT Filed: Jun. 23, 2016

(86) PCT No.: PCT/EP2016/064495
§ 371 (c)(1),
(2) Date: Jan. 2, 2018

(87) PCT Pub. No.: WO2017/001268
PCT Pub. Date: Jan. 5, 2017

(65) Prior Publication Data
US 2018/0191514 A1 Jul. 5, 2018

(30) Foreign Application Priority Data
Jun. 30, 2015 (EP) ..................................... 15174615

(51) Int. Cl.
H02J 3/14 (2006.01)
H04L 12/10 (2006.01)
(Continued)

(52) U.S. Cl.
CPC ................ *H04L 12/10* (2013.01); *H02J 1/00* (2013.01); *H02J 3/00* (2013.01); *H02J 13/0006* (2013.01);
(Continued)

(58) Field of Classification Search
CPC ........ H04L 12/10; H04L 12/2803; H02J 1/00; H02J 3/00; G01R 19/145; G06F 1/266; H01J 1/00
See application file for complete search history.

(56) References Cited

U.S. PATENT DOCUMENTS 8,205,102 B2    6/2012  Kabbara et al.
2004/0082369 A1*  4/2004  Dayan .................... H01R 13/22
                                                    455/573

(Continued)

FOREIGN PATENT DOCUMENTS

WO    2012038858 A2    3/2012
WO    2013110071 A1    7/2013
WO    2015018656 A1    2/2015

*Primary Examiner* — Hal Kaplan
*Assistant Examiner* — Rasem Mourad

(57) ABSTRACT

The present invention provides a support system for supporting the commissioning of a networked power distribution system (1). The networked power distribution system comprises at least one power supply (2) with one or more power connectors (12, 12a) for supplying power to the one or more power connectors and a data communication interface for exchanging communication data. The support system (6) comprises one or more load device detectors (7) for detecting the connecting and/or disconnecting of a load device (3a) to/from a power connector (12a), and a commissioning tool (8) for performing steps of commissioning the networked power distribution system with regard to the load device. The commissioning tool is adapted to automatically perform at least some of the commissioning steps in response to the detection of the connecting and/or discon-
(Continued)

necting of the load device. This can allow for a relatively easy commissioning of the networked power distribution system.

14 Claims, 4 Drawing Sheets

(51) Int. Cl.
 *H02J 3/00* (2006.01)
 *H04L 12/28* (2006.01)
 *H02J 13/00* (2006.01)
 *H02J 1/00* (2006.01)
 *G01R 19/145* (2006.01)

(52) U.S. Cl.
 CPC ........ *H04L 12/2803* (2013.01); *G01R 19/145* (2013.01); *Y02B 70/30* (2013.01); *Y04S 20/20* (2013.01)

(56) References Cited

U.S. PATENT DOCUMENTS

| | | | |
|---|---|---|---|
| 2004/0230846 A1* | 11/2004 | Mancey | H04L 12/10 713/300 |
| 2006/0143583 A1* | 6/2006 | Diab | G06F 1/189 713/300 |
| 2007/0132487 A1* | 6/2007 | Kestelli | H04L 12/10 327/108 |
| 2007/0206749 A1* | 9/2007 | Pincu | H04L 12/10 379/142.1 |
| 2010/0007334 A1* | 1/2010 | Apfel | H04L 12/10 324/123 R |
| 2013/0191654 A1* | 7/2013 | Schlichter | G06F 1/266 713/300 |
| 2013/0339760 A1* | 12/2013 | Zimmerman | G06F 1/26 713/300 |
| 2014/0152102 A1 | 6/2014 | Chen | |
| 2014/0265550 A1 | 9/2014 | Milligan et al. | |
| 2016/0349821 A1* | 12/2016 | Ramalingam | G06F 1/3203 |

\* cited by examiner

SUPPORTING THE COMMISSIONING OF A NETWORKED POWER DISTRIBUTION SYSTEM

CROSS-REFERENCE TO PRIOR APPLICATIONS

This application is the U.S. National Phase application under 35 U.S.C. § 371 of International Application No. PCT/EP2016/064495, filed on Jun. 23, 2016, which claims the benefit of European Patent Application No. 15174615.3, filed on Jun. 30, 2015. These applications are hereby incorporated by reference herein.

FIELD OF THE INVENTION

The present invention relates to a support system for supporting the commissioning of a networked power distribution system for supplying power to and exchanging communication data with one or more load devices. The present invention further relates to a corresponding support method for supporting the commissioning of a networked power distribution system and to a computer program for controlling the support system.

BACKGROUND OF THE INVENTION

System commissioning (also referred to as system configuration) is a notoriously difficult task, especially for systems using shared medium communication like wireless communication systems or powerline communication systems. A factory pre-configuration is usually only feasible for small systems; in big systems it is likely to result in incorrect behavior, when seemingly identical, but differently programmed devices (for instance, pre-programmed to operate in different locations, e.g., meeting rooms vs. offices vs. floors, or in different modes, e.g., including a presentation mode) get installed at incorrect locations. Automatic commissioning may not be intelligent or flexible enough. For instance, automatic distance and position estimation, be it based on radio, optical, sound, or powerline techniques, may not be precise enough due to the very nature of the shared medium communication. Moreover, the automatic algorithms and application configuration rules may not be able to cope with the variety of room topologies, arrangements and intended usages. On the other hand, manual commissioning, i.e., a commissioning that involves a user, is often time-consuming and error-prone and generally requires special means, such user interface elements (e.g., LEDs, buttons, displays) or even dedicated tools. Moreover, the user must usually have a profound understanding of the system to be configured and quite often even a basic understanding of the underlying communication technology at least of its typical behaviors and potential problems in order to successfully perform the commissioning process.

Bus-powered systems, like the EMerge DC grid of the EMerge Alliance, promise ease of installation; the load can be simply attached anywhere on the power bus, even by the untrained end-user. Similarly, in the Power-over-Ethernet (PoE) systems, plugging the Ethernet cable into a PoE port of the PoE power sourcing equipment (PSE) should be enough to provide a powered device (PD) with power and access to the communication network. To fulfill these promises, a relatively easy commissioning solution is required in order to, for instance, map system identifiers of particular devices (e.g., hardware identifiers and/or network addresses) to physical device instances and their physical locations.

WO 2013/110071 A1 discloses a power sourcing equipment that is connected to a powered device via a cable. The power sourcing equipment is configured to provide power to different types of devices. The power sourcing equipment has a control system for determining the type of powered device that is connected to the cable and furnishes power in response to the determination. Also disclosed is a powered device capable of establishing communication with PSEs of multiple types.

US 2014/0152102 A1 discloses a switching device is for use with electronic apparatuses and for use in transmitting data and power therebetween automatically or manually. The switching device includes a first transmission module, voltage dividing unit, second transmission module, switching module, hub module, expansion unit, and switching units. The switching device switches automatically between a plurality of path configurations formed from the switching module and the hub module according to a voltage change generated because of connection of the first transmission module and the electronic apparatuses, such that the electronic apparatuses can transmit data and power through the path configurations. Alternatively, the switching units change one of the path configurations manually to allow the electronic apparatuses to transmit data and power through one of the path configurations.

SUMMARY OF THE INVENTION

It is an object of the present invention to provide a support system for supporting the commissioning of a networked power distribution system for supplying power to and exchanging communication data with one or more load devices, which can allow for a relatively easy commissioning of the networked power distribution system. It is a further object of the present invention to provide a corresponding support method for supporting the commissioning of a networked power distribution system and a computer program for controlling the support system.

In a first aspect of the present invention, a support system for supporting the commissioning of a networked power distribution system for supplying power to and exchanging communication data with one or more load devices is provided, the networked power distribution system comprising at least one power supply with one or more power connectors for supplying power to the one or more power connectors and a data communication interface for exchanging communication data with the one or more load devices, wherein the support system comprises:

one or more load device detectors for detecting the connecting and/or disconnecting of a load device to/from a power connector, and a commissioning tool for performing steps of commissioning the networked power distribution system with regard to the load device, wherein the commissioning tool is adapted to automatically perform at least some of the commissioning steps in response to the detection of the connecting and/or disconnecting of the load device, wherein the one or more load device detectors are adapted to generate an information indicative of one or more of (i) the connecting and (ii) the disconnecting, wherein the commissioning tool is adapted to utilize the information in performing the at least some of the commissioning steps, wherein the information includes a power connector information indicative of the power connector to/from which the load device is being connected and/or disconnected and/or a power supply information indicative of the power supply (2) supplying the power thereto.

Since the one or more load device detectors detect the connecting and/or disconnecting of the load device to/from the power connector, and since the commissioning tool automatically performs at least some of the commissioning steps in response to the detection of the connecting and/or disconnecting of the load device, the commissioning of the networked power distribution system can, at least partly, be automated and therewith simplified. Moreover, by utilizing the information that is generated by the one or more load device detectors, the commissioning of the networked power distribution system can be further simplified. The power connector information and/or the power supply information represent information about the location of the load device in the networked power distribution system. Such location information can helpful, for instance, for establishing application level control relationships with regard to the load device. For instance, based on the generated location information, some at least partially automated steps of commissioning the networked power distribution may have the effect that all load devices in a particular meeting room, office, or floor, which may all be connected to a particular power connector or power supply or to a particular group of power connectors or power supplies, can be controlled by the same user interface elements (e.g., LEDs, buttons, displays). The location information generated by the one or more load device detectors may be used to supplement location information available via other means, e.g., via the data communication interface (e.g., the link quality/RSSI, the list of direct neighbor load devices), optical communication or entered via the user (e.g., by selecting, typing in or scanning some device/location tags, like barcodes, QR codes, RFID tags, et cetera), so that more, and preferably fully, accurate location information (e.g., meeting room, office, or floor) can be obtained. The allocation of the load device to the power connector and/or the power supply may be configured into the load device itself or it may be stored by the commissioning tool or the networked power distribution system, e.g., in the power supply, in a dedicated per-port/per-power supply device or in a centralized device (e.g., a management entity such as a Building Management System; BMS). This knowledge may be further used upon removal or repositioning of the load device. Alternatively, the location information can be used solely for configuration of the load device (e.g., appropriate allocation to network segment and configuration of application level (control) relationships), and then removed; to be rediscovered if required.

The networked power distribution system can be of various types, preferably of shared power supply. It can be an AC mains cable, e.g., for 110/120 V or 220/230 V. It can be a DC power bus system, for instance, based on the EMerge 24 V Occupied Space standard or the upcoming EMerge Smart Ceiling Solutions, which are likely to be based on slightly higher DC voltages (most likely still within the Class 2 limitation). An advantage of the EMerge systems is that they consist of identifiable electricity rails having a limited physical span; in combination with a connection to a particular power supply device, this provides for a "meaningful" location. Alternatively, the networked power distribution system can be a Power-over-Ethernet (PoE) system, e.g., in a classical configuration (i.e., in a star topology), or allowing for a daisy-chaining of load devices.

The data communication interface can utilize any wire-free communication, like infrared communication, visual light communication, or wireless communication, including ZigBee, ZigBee Light Link, ZigBee Building Automation, 802.11/IPv4/IPv6, 6LoWPAN, or any other applicable wireless solution. The data communication interface can utilize the at least one power supply itself for communication, by using powerline communication solutions, from simple signaling, via dedicated controls solution, like that provided over DC bus systems by Yamar, up to full-fledged communication protocols, like HomePlug. In case of PoE, Ethernet can be utilized for communication.

The load device can be any type of load device, for instance, a building automation and management device, like a lighting device (e.g., a lamp, a sensor, a switch), a HVAC device (Heating, Ventilation and Air Conditioning), a safety and access control device, et cetera, an IT device (like a laptop, an IP telephone, a printer, an access point, a beamer, et cetera), and a white goods device (like a fridge, a water cooker, a coffee machine, et cetera). Moreover, the load device may be a collection of multiple load devices (e.g., a luminaire containing two fluorescent tubes for warm and cold white, a segmented luminaire with each segment having a spatially different light effect, e.g., for creating zones, a luminaire combining multiple functions, e.g., a focused downward task lighting and a generally upward ambient lighting, or a white and a colored lighting), which can potentially be operated separately.

In various embodiments, the detection of the load device being connected to and/or disconnected from the power connector can be performed by different realizations of the one or more load device detectors. For instance, the one or more load device detectors may be comprised by the at least one power supply device (e.g., a PoE port), by other load devices on a same power bus, by a power bus itself (e.g., EMerge rails), and/or they may be dedicated devices. The one or more load device detectors can be modular, i.e., they can consist of detectors connected to the networked power distribution system itself and (an) interface unit(s) to which they report. The one or more load device detectors, especially if they are dedicated devices and also movable independently of the networked power distribution system, may need to be configured themselves before being used. If the one or more load device detectors are dedicated devices, they can be temporary devices, used only for the time of (re-)configuration of the networked power distribution system, or they can be an integral part of the networked power distribution system, e.g., integrated with some other functions, units or devices, like a communication bridge, power control device, et cetera. Preferably, the installation of such dedicated devices is as easy as the connecting and/or disconnecting of the load device itself.

The detection of the disconnecting of the load device may trigger some automatic (re-)configuration actions for the data communication interface, e.g., removal/de-activation of the load device in a trust center's list, updating a network key, removal/update/de-activation of allocation layer control relationships (pairings/bindings), network topology optimization, et cetera. It may be triggered immediately or after a timeout, e.g., to allow for connecting back a repaired load device or moving the load device to a new location. The actions upon detachment may be fixed, based on rules, or controllable by the user on a device by device basis.

It is preferred that the one or more load device detectors are adapted to detect the connecting and/or disconnecting of the load device based on one or more of (i) monitoring a change of a characteristic related to the supply of power, (ii) a power negotiation process performed between the at least one power supply and the load device, and (iii) a mechanical process (e.g., by monitoring the opening or closing of a contact, which is caused by inserting/removing a cable into a power connector, or by monitoring the interrupting or re-establishing of an optical connection, which is caused by inserting/removing the cable into the connector, et cetera). In particular, the detection technique used by the one or more load device detectors is typically dependent on the used networked power distribution system. For example, in a PoE system, the one or more load device detectors can use the power negotiation exchange. They may also use the methods described in International Patent Application WO 2012/038858 A2 ("Disaggregation apparatus for identifying an appliance in an electrical network"), the entire contents of which are herewith incorporated by reference. These methods allow to monitor changes in the operational state of a load device in an electrical network based on switching a switchable load device and monitoring changes in a voltage while the switchable load device is being switched. In a preferred example, the load device detection is based on monitoring a change of the power supplied to the power connector when the load device is connected thereto resp. disconnected therefrom.

Preferably, the at least some of the commissioning steps include steps of commissioning the data communication interface with regard to the load device. For instance, the act of connecting a load device to a power connector of the networked power distribution system may trigger steps of opening the network for joining, letting the (selected) load devices of the network move to a commissioning channel, adding a new load device to a trust center's (access control) list, sending a network key, assigning an address, creating of application level control relationships (pairings/bindings), optimizing the network topology, which may include placing certain nodes in network segments, selecting the data communication interface of nodes (if multiple interfaces are supported, e.g., both ZigBee and Ethernet) and/or configuring group memberships, et cetera. Rules can be pre-defined/configured for providing this configuration information, e.g., each power supply can get a unique address pool assigned, and it can be defined that each/particular N power connectors build a group. Binding rules can be pre-determined as well, e.g., all lamps in a group reacting to commands from all sensors in the same group. Other rules can be pre-configured at the one or more load device detectors, e.g., allowable load device types, numbers, et cetera. In case of problems, the supply of power and/or the communication of data to the new load device may be discontinued or, e.g., a service engineer can be informed to check the situation locally. In various embodiments, the exchange of communication data can take place between various communication peers: the one or more load device detectors and the newly connected load, the at least one power supply and/or a power connector, a controller, like a Building Management System (BMS) or a floor controller or a gateway, and/or the commissioning tool.

It is preferred that the one or more load device detectors are further adapted to generate an information indicative of (iii) a characteristic of the load device, wherein the commissioning tool is adapted to utilize the information in performing the at least some of the commissioning steps. By utilizing such an information that is generated by the one or more load device detectors, the commissioning of the networked power distribution system can be further simplified. The functionality provided by the one or more load device detectors may vary. In one embodiment, the one or more load device detectors can determine the power consumption of the load device. In yet another embodiment, they can determine a type of the load device, e.g., a capacitive load device rather than an inductive load device. In yet another embodiment, they can determine the exact device type (e.g., a CFL light (Compact Fluorescent Lamp) of 10 W power consumption). This information may be used, for instance, in determining whether the load device is allowed to be connected to the power connector (see below).

It is further preferred that, if multiple load devices are connected to the power connector and the load device is disconnected from the power connector, the information includes one or more of (i) a load device identity information indicative of the identity of the load device being disconnected, (ii) a characteristic of the load device indicative of the type of the load device being disconnected, (iii) a power connector information indicative of the power connector from which the load device is being disconnected, and (iv) a power supply information indicative of the power supply supplying the power thereto. Depending on the embodiment, the one or more load device detectors may be able to directly detect which load device is being disconnected. In a simpler embodiment, they may be able to detect only that a load device is being disconnected from the power connector and may need to trigger a discovery procedure to determine the still connected load devices and thus the disconnected load device.

It is preferred that generating the information indicative of a characteristic of the load device includes performing a training procedure on the load device, wherein the training procedure includes controlling the at least one power supply to supply a characteristic power to the power connector to which the load device is connected and/or controlling the load device in a characteristic manner via the data communication interface. As mentioned above, the characteristic of the load device may include, e.g., the type of the load device, and the training procedure may include a cycle of power on/off or other special behavior, e.g., continuous dimming. This behavior may be pre-programmed into the load device, or it may be requested via the data communication interface, from the power supply, the one or more load device detectors, the commissioning tool or another device. There may be local hardware means on the load device to trigger the training procedure. The training behavior may be same for all types of load devices or it may be type-dependent. It shall be noted that a load device may be a collection of multiple loads (e.g., a luminaire containing two fluorescent tubes, for warm and cold white), which can potentially be operated separately. Such a load device may require additional steps in the training procedure, e.g., each of the elements may need to be discovered separately.

It is further preferred that the at least some of the commissioning steps include determining whether the load device is allowed to be connected to the power connector. For instance, if the load device is not allowed in the networked power distribution system (temporarily, at the specific location, or at all), the commissioning can be abandoned. Preferably, the commissioning tool is adapted, if it is determined that the load device is not allowed to be connected to the power connector, to control the networked power distribution system to not provide power to the load device. For instance, it may be possible to remove the power supplied to such "illegal" load device, especially, if the load device is the only one connected to the power connector or if it is the last load device in a load device chain.

It is preferred that the at least some of the commissioning steps include steps of establishing application level control relationships (pairings/bindings) with regard to the load device. Moreover, it is preferred that the commissioning tool is adapted to verify established application level control relationships with regard to a group of load devices, wherein the verifying includes controlling the group of load devices via the data communication interface and utilizing an information from the one or more load device detectors, wherein the information is indicative of a change of a characteristic related to the supply of power caused by the controlling. For instance, the group of load devices can be turned on and off via the data communication interface and the corresponding change in the power supplied to the load devices can be monitored by the one or more load device detectors and then used by the commissioning tool to verify the correctness of the mapping of the load devices to power supply/power connector and control groups.

It is preferred that the commissioning tool is adapted to perform steps of commissioning the data communication interface with regard to a load device not yet powered by any power connector and, in response thereto, to control the at least one power supply to supply power to a power connector to which the load device is connected and/or to supply power to a power connector to which no load device is yet connected and/or to activate a load device detector. In particular, the load device detection functionality provided by the one or more load device detectors can be always present in the networked power distribution system and always active. Alternatively, it may be activated at selected moments, e.g., when the commissioning process is activated. For instance, it can be triggered via the data communication interface. Depending on the specifics of the networked power distribution system and the data communication interface, and possibly the type of commissioning action intended (add, remove, replace a load device, et cetera), the one or more load device detectors may comprise a number of load device detectors and the load device detection functionality may be enabled only on a subset of the number of load device detectors. For example, if the networked power distribution system only allows for a limited number of load devices and/or a limited wattage per power connector, only load detectors corresponding to the not fully loaded power connectors could be activated. This can be achieved by addressing the one or more load device detectors individually or by specifying the activation conditions in an activation command. In another realization, it can be automatically activated by a physical action, e.g., connecting a dedicated load device detector to the networked power distribution system (e.g., clipping it on an EMerge power rail) or when a new load device gets connected to a power connector, e.g., by closing a contact. In yet another realization, it can be breaking or establishing of optical connection, caused by inserting, removing or moving around connector parts. The temporary and/or selective activation of the one or more load device detectors may be especially beneficial, if the load device detection process is very resource-intensive (e.g., requires a lot of power, requires many computational cycles, or requires exchange of a number of communication packets, esp. broadcast communication packets over shared medium).

In a further aspect of the present invention, a networked power distribution system for supplying power to and exchanging communication data with one or more load devices is provided, wherein the networked power distribution system comprises:

at least one power supply with one or more power connectors for supplying power to the one or more power connectors, a data communication interface for exchanging communication data with the one or more load devices, the support system as defined in claim 1 for supporting the commissioning of the networked power distribution system.

In a further aspect of the present invention, a support method for supporting the commissioning of a networked power distribution system for supplying power to and exchanging communication data with one or more load devices is presented, the networked power distribution system comprising at least one power supply with one or more power connectors for supplying power to the one or more power connectors and a data communication interface for exchanging communication data with the one or more load devices, wherein the support method comprises:

detecting the connecting and/or disconnecting of a load device to/from a power connector, by one or more load device detectors, and performing steps of commissioning the networked power distribution system with regard to the load device, by a commissioning tool, wherein at least some of the commissioning steps are automatically performed in response to the detection of the connecting and/or disconnecting of the load device, wherein the one or more load device detectors generate an information indicative of one or more of (i) the connecting and (ii) the disconnecting, wherein the commissioning tool utilizes the information in performing the at least some of the commissioning steps, wherein the information includes a power connector information indicative of the power connector to/from which the load device is being connected and/or disconnected and/or a power supply information indicative of the power supply supplying the power thereto.

In a further aspect of the present invention a computer program for controlling the support system as defined in claim 1 is presented, wherein the computer program comprises program code means for causing the support system to carry out the support method as defined in claim 13, when the computer program is run on the power distribution system.

It shall be understood that the support system of claim 1, the support method of claim 13, and the computer program of claim 14, have similar and/or identical preferred embodiments, in particular, as defined in the dependent claims.

It shall be understood that a preferred embodiment of the present invention can also be any combination of the dependent claims or above embodiments with the respective independent claim.

These and other aspects of the invention will be apparent from and elucidated with reference to the embodiments described hereinafter.

DETAILED DESCRIPTION OF EMBODIMENTS

Figure 1:
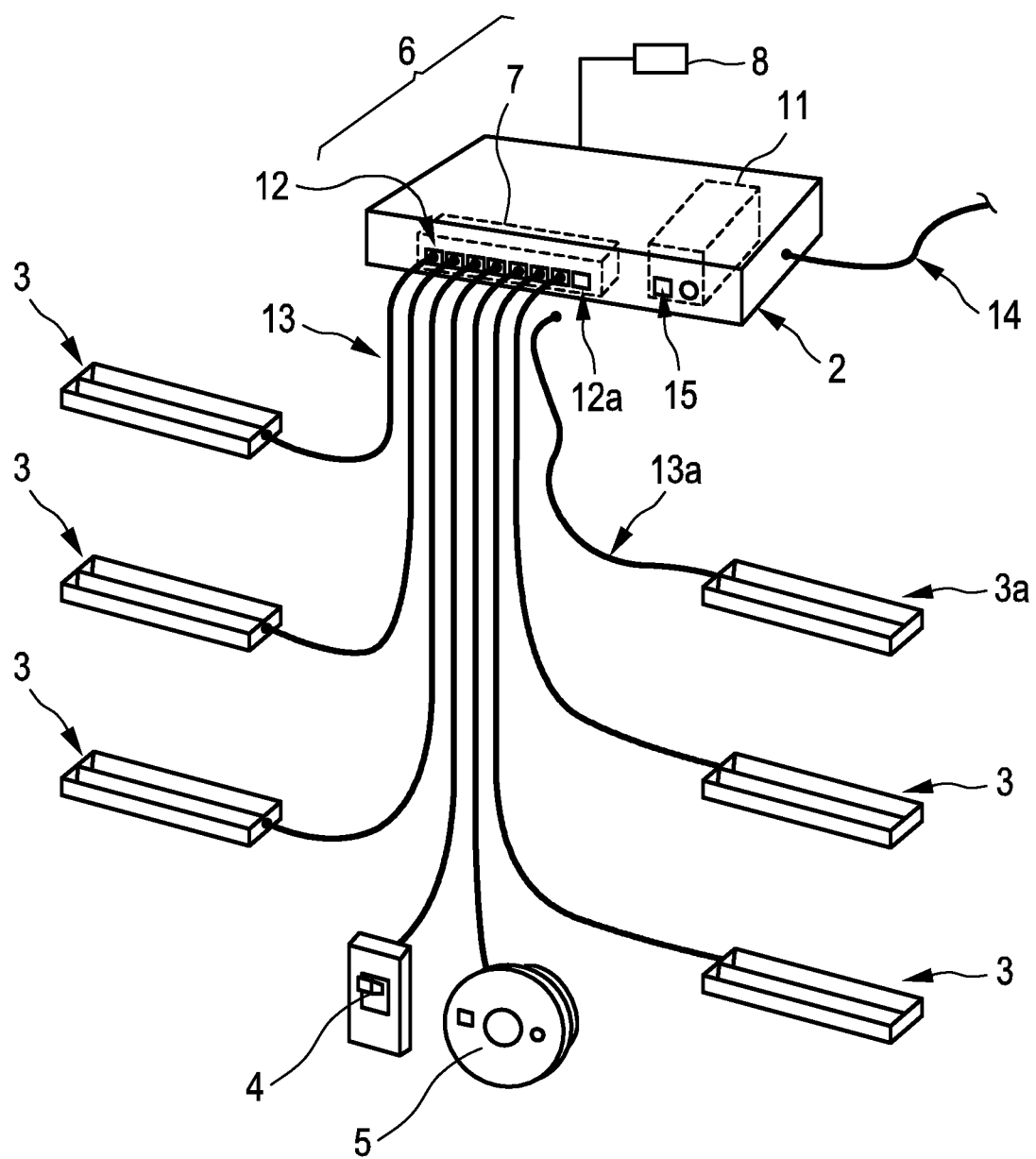
FIG. 1 shows schematically and exemplarily an embodiment of a networked power distribution system for supplying power to and exchanging communication data with one or more load devices.

FIG. 1 shows schematically and exemplarily an embodiment of a networked power distribution system 1 for supplying power to and exchanging communication data with one or more load devices 3, 4, 5 and 3a. The networked power distribution system 1 comprises at least one power supply 2 (only one of which is shown in the figure) with one or more, here, eight, power connectors 12 and 12a for supplying power to the one or more power connectors 12 and 12a. In this embodiment, the networked power distribution system 1 is a PoE system and the at least one power supply 2 is a switch—commonly also referred to as PoE power sourcing equipment—comprising a power supply unit 11.

In this embodiment, the power connectors 12 and 12a are realized as ports that allow the load devices 3, 4, 5 and 3a to be connected via Ethernet cables 13 and 13a, which are adapted to convey the supplied power along with the communication data. The power supply 2 receives an input power via a connection 14 that may be directly connected to a mains outlet, a DC power grid or a battery (not shown in the figure), and some of the communication data may be received from another device (not shown in the figure), e.g., another switch, via a further Ethernet cable at a further port 15. From the received input power, the power supply unit 11 generates the power to be supplied to the load devices 3, 4, 5 and 3a via the power connectors 12 and 12a.

In this example, the load devices 3, 4, 5 and 3a include luminaires 3 and 3a, a switching element 4 and a presence sensor 5. With the networked power distribution system 1, it may be foreseen that the switching element 4 and/or the presence sensor 5 sends on/off, scene or dimming commands to the luminaires 3 and 3a after the switching element 4 has been actuated by a person and/or the presence of a person has been detected by the presence sensor 5. This requires a commissioning of the networked power distribution system 1 to appropriately associate the switching element 3 and the presence sensor 5 with the luminaires 3 and 3a (wherein the established information can reside in the controlling device (s), here, the switching element 3 and/or the presence sensor 5, in the controlled device(s), here, the luminaires 3 and 3a, a central device, such as a controller, gateway, et cetera, wherein, here, this role may be performed by the power supply 2, or any combination thereof). Such commissioning may be supported by the techniques of the present invention. To this end, a support system 6 for supporting the commissioning of the networked power distribution system 1 is provided. The support system 6 comprises one or more load device detectors 7, here, one for each power connector 12 and 12a, for detecting the connecting and/or disconnecting of a load device 3a, here, the luminaire, to/from a power connector 12a and a commissioning tool 8 for performing steps of commissioning the networked power distribution system 1 with regard to the load device 3a. The commissioning tool 6 is adapted to automatically perform at least some of the commissioning steps in response to the detection of the connecting and/or disconnecting of the load device 3a.

In this embodiment, the load device detectors 7 are adapted to detect the connecting and/or disconnecting of the load device 3a based on a power negotiation process performed between the at least one power supply 2 and the load device 3a. In other embodiments, such detection may also be based on monitoring a change of a characteristic related to the supply of power and/or a mechanical process.

The load device detectors 7, here, are adapted to generate an information indicative of the connecting, wherein, here, the information includes a power connector information indicative of the power connector 12a to which the load device 3a is being connected and a power supply information indicative of the power supply 2 supplying the power thereto. This information is provided to the commissioning tool 8, which utilizes it in performing the at least some of the commissioning steps. For instance, the power connector information and/or the power supply information, which represent information about the location of the load device in the networked power distribution system, are preferably used for at least partially automating the commissioning the data communication interface with regard to the load device 3a. In particular, they are preferably used for at least partially automating the establishing of application level control relationships with regard to the load device.

The one or more load device detectors 7, here, can be adapted to further generate an information indicative of a characteristic of the load device 3a, wherein the commissioning tool 8 is adapted to also utilize this information in performing the at least some of the commissioning steps. For instance, the characteristic can comprise a power consumption of the load device 3a, a type of the load device 3a, e.g., a capacitive load device rather than an inductive load device, or even the exact device type (e.g., a CFL light (Compact Fluorescent Lamp) of 10 W power consumption). This information may be used, for instance, in determining whether the load device 3a is allowed to be connected to the power connector 12a (see below). Also, knowledge about the (exact) device type, e.g., luminaire vs. switching element vs. presence sensor, can be used in the establishing of the application level control relationships with regard to the load device 3a.

Generating the information indicative of a characteristic of the load device 3a, here, may include performing a training procedure on the load device 3a, wherein the training procedure includes controlling the at least one power supply 2 to supply a characteristic power to the power connector 12a to which the load device 3a is connected and/or controlling the load device 3a in a characteristic manner via the data communication interface. The characteristic of the load device may include, e.g., the type of the load device, and the training procedure may include a cycle of power on/off or other special behavior, e.g., continuous dimming.

In the following, an embodiment of support method for supporting the commissioning of the networked power distribution system 1 shown in FIG. 1 will exemplarily be described with reference to a flowchart shown in FIG. 2.

In step S101, one or more load device detectors 7 detect the connecting and/or disconnecting of a load device 3a to/from a power connector 12a.

In step S102, a commissioning tool 8 performs steps of commissioning the networked power distribution system 1 with regard to the load device 3a, wherein at least some of the commissioning steps are automatically performed in response to the detection of the connecting and/or disconnecting of the load device 3a.

Figure 2:
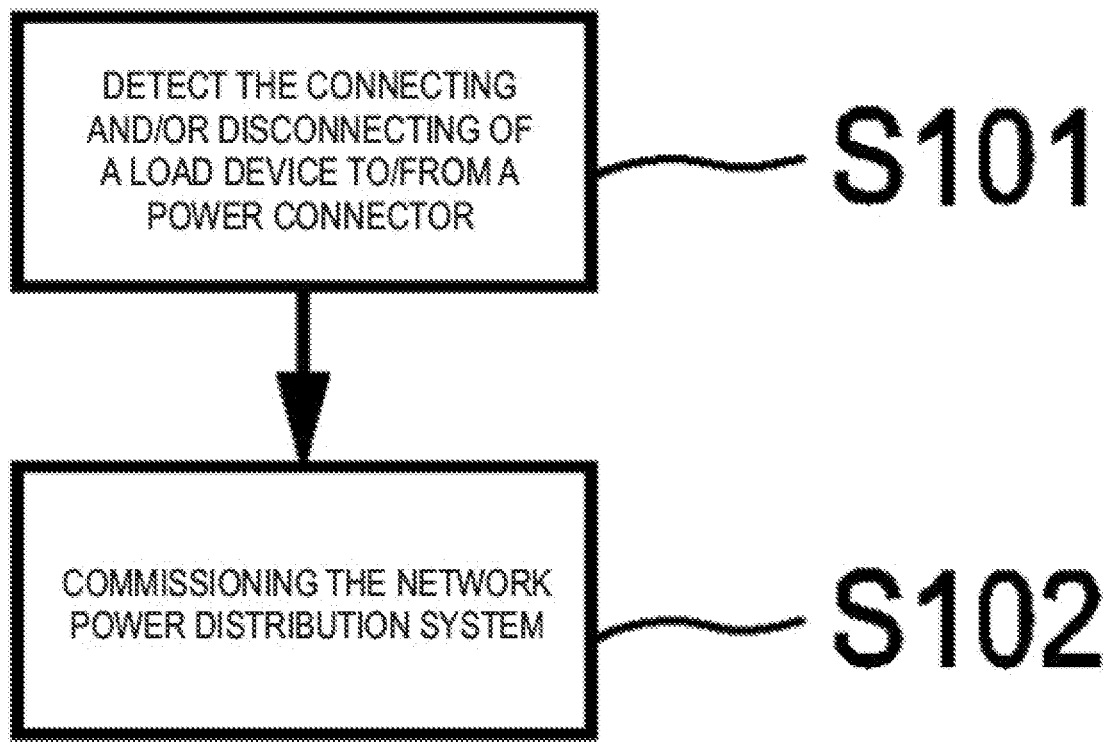
FIG. 2 shows a flowchart exemplarily illustrating an embodiment of a support method for supporting the commissioning of the networked power distribution system shown in FIG. 1.
Figure 3:
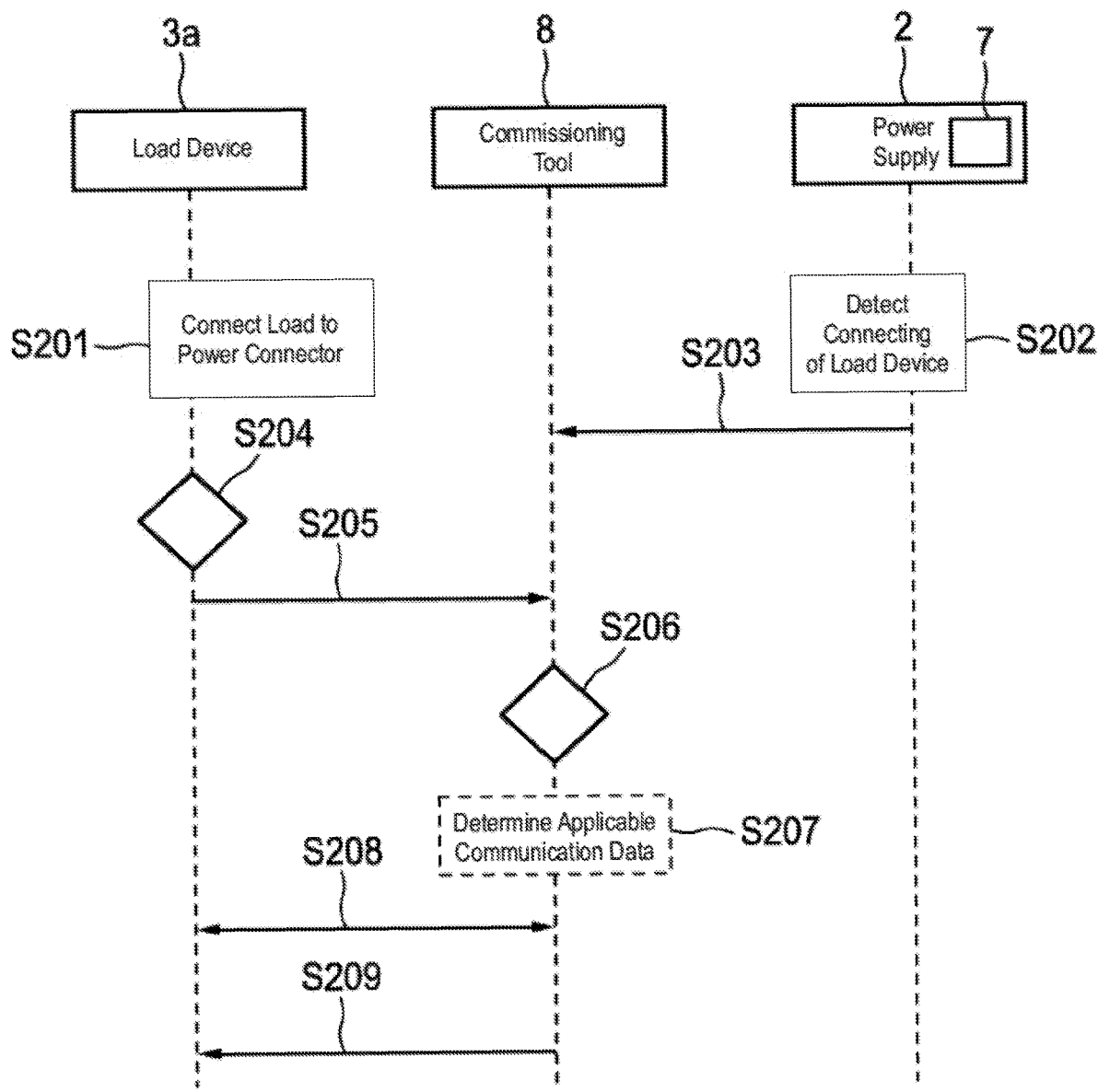
FIG. 3 shows a more detailed flowchart exemplarily illustrating a sequence of operations performed by the support method shown in FIG. 2.

A more detailed flowchart exemplarily illustrating a sequence of operations performed by the support method shown in FIG. 2 is shown in FIG. 3. Here, the at least one power supply 2 of the networked power distribution system 1 comprises the one or more load device detectors 7 and the commissioning tool 8 is a dedicated device. In this example, the load device 3a, here, the luminaire, is being connected to a power connector 12a (step S201). In step S202, the one or more load device detectors 7 detect the connecting of the load device 3a and generate an information indicative of the connecting, wherein, here, the information includes a power connector information indicative of the power connector 12a to which the load device 3a is being connected and a power supply information indicative of the power supply 2 supplying the power thereto. Preferably, the one or more load device detectors 7 are further adapted to generate an information indicative of a characteristic of the load device 3a, wherein, here, the information may include more detailed information about a type of the load device 3a and/or its power consumption. In step S203, the information is communicated (reported or pollable), e.g., via a voltage level of a particular power connector (e.g., as done by the EMerge power supply units of Nextec), via Ethernet, via any other wired connection, via wireless communication system, via an optical communication system, or via any combination of those means, to the commissioning tool 8, which automatically performs at least some of the steps of commissioning the networked power distribution system 1 with regards to the load device 3a in response to the detection of the connecting of the load device 3a. (It shall be noted that in another embodiment, a more explicit indication of the connecting resp. the disconnecting can be used, e.g., a flag in a regular voltage level report or a dedicated alert.) In this example, the load device 3a checks in step S204 whether it is already commissioned and, since this is found not to be the case, searches for a network in step S205. The commissioning tool 8, which is used for configuration of networked power distribution system 1, in particular, the data communication interface, receives the information from the at least one power supply 2, receives the initial data communication of the new load device 3a (e.g., network scan, joining requests, key requests), and thus may be able to automatically—at least partly—map the new load device 3a to its location in the networked power distribution system 1 (power supply/power connector), and configure the load device 3a accordingly. The commissioning procedure, in this example, includes determining whether the information was received from at least one power supply 2 (step S206), determining whether the load device 3a is allowed to be connected to the power connector 12a and determining the applicable communication data (step S207), the exchange of communication data (e.g., network identified, unique address and/or network key, et cetera) (step S208) and the configuration of group relationships (S209). This method, with a dedicated commissioning tool 8, has the following advantage: The specifics of the data communication interface used by the load device 3a and the power supply 2 may differ, as long as the commissioning tool 8 can communicate using each of them. Thus, legacy power supplies can be used. Moreover, for PoE and EMerge systems, the necessary hardware for realizing the one or more load device detectors is typically already present in the power supply, since current limits need to be applied for the UL-Class-2 classified systems.

Figure 4:
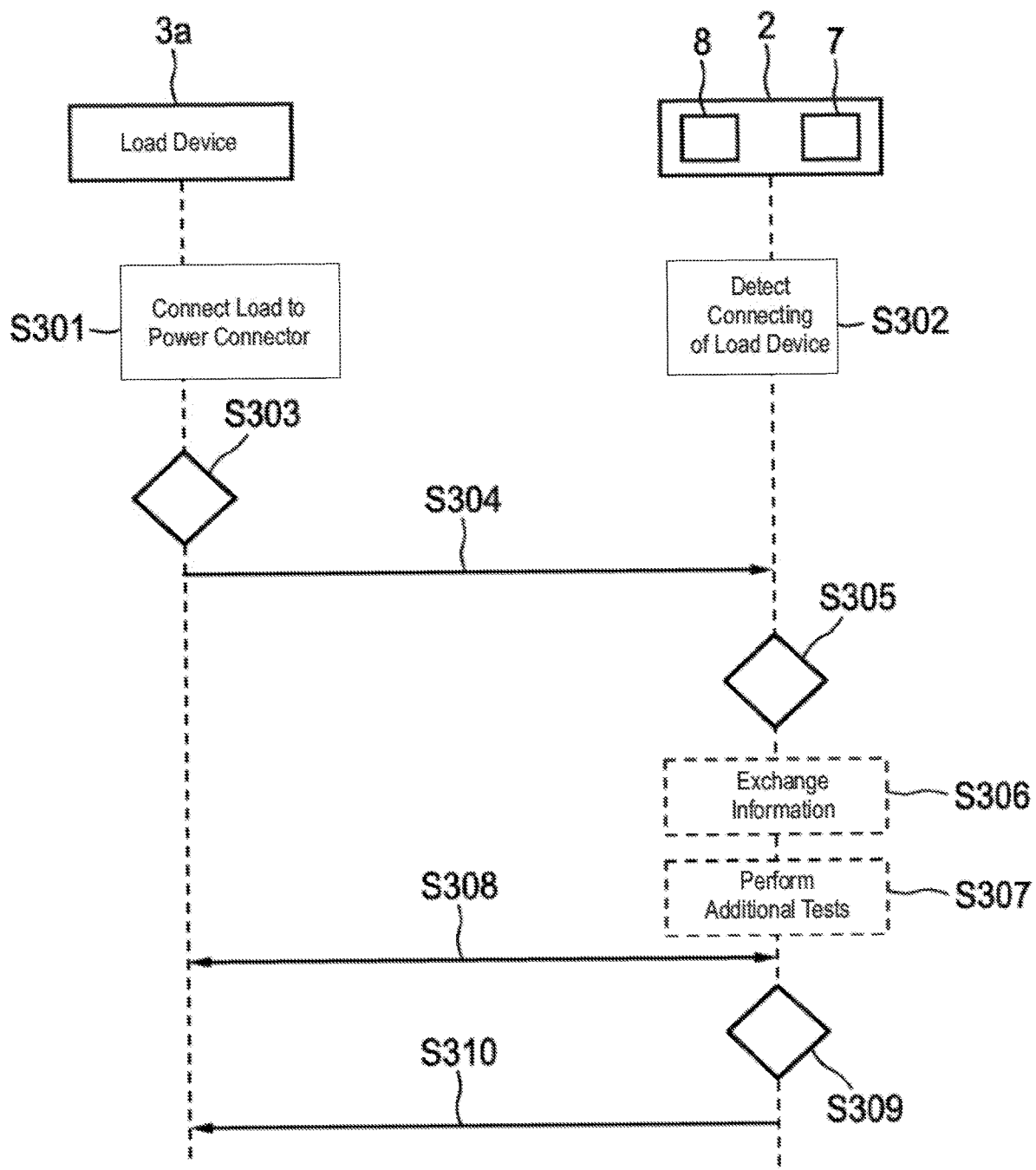
FIG. 4 shows a more detailed flowchart exemplarily illustrating a sequence of operations performed by a variant of the support method shown in FIG. 2.

FIG. 4 shows a more detailed flowchart exemplarily illustrating a sequence of operations performed by a variant of the support method shown in FIG. 2. Here, the at least one power supply 2 of the networked power distribution system 1 comprises the one or more load device detectors 7 as well as the commissioning tool 8. In this example, the load device 3a, here, the luminaire, is being connected to a power connector 12a (step S301). In step S302, the one or more load device detectors 7 detect the connecting of the load device 3a and generate an information indicative of the connecting, wherein, here, the information includes a power connector information indicative of the power connector 12a to which the load device 3a is being connected and a power supply information indicative of the power supply 2 supplying the power thereto. Preferably, the one or more load device detectors 7 are further adapted to generate an information indicative of a characteristic of the load device 3a, wherein, here, the information may include more detailed information about a type of the load device 3a and/or its power consumption. In this example, the load device 3a checks in step S303 whether it is already commissioned and, since this is found not to be the case, searches for a network in step S304. Once the connecting of the new load device 3a is confirmed (step S305), the power supply 2 uses the data communication interface to check with a management entity (BMS, trust center) (not shown in the figure), if currently adding this load device type at this location is allowed (or was even announced to the BMS) and/or requests the provision of the communication information to the new load device 3a. Alternatively, the power supply 2 performs different actions depending on whether an allowance from the management entity was obtained before. The power supply 2 and the management entity can exchange additional information about the connected load device 3a (step S306). Moreover, the management entity can request the power supply or other devices to perform additional tests, e.g., related to the power characteristics of the connected load device 3a, e.g., to confirm the type of the load device 3a or the power consumption of the load device 3a and/or some additional data exchanges over the data communication interface (step S307). If the connected load device 3a is allowed to be added to the networked power distribution system 1, the power supply 2 provides (optionally only forwarding the configuration information from the management entity) the new load device 3a with the configuration information obtained from the management entity, and/or triggers the process for providing the required information (e.g., unique address, network key, group membership, bindings, et cetera) itself (steps S308 to S310).

Other variations to the disclosed embodiments can be understood and effected by those skilled in the art in practicing the claimed invention, from a study of the drawings, the disclosure, and the appended claims.

For instance, in the embodiment of a networked power distribution system 1 for supplying power to and exchanging communication data with one or more load devices 3, 4, 5 and 3a shown in FIG. 1, if multiple load devices are connected to the power connector 12a and the load device 3a is disconnected from the power connector 12a, the information can include one or more of (i) a load device identity information indicative of the identity of the load device 3a being disconnected, (ii) a characteristic of the load device 3a indicative of the type of the load device 3a being disconnected, (iii) a power connector information indicative of the power connector 12a from which the load device 3a is being disconnected, and (iv) a power supply information indicative of the power supply 2 supplying the power thereto. Depending on the embodiment, the one or more load device detectors 7 may be able to directly detect which load device is being disconnected. In a simpler embodiment, they may be able to detect only that a load device 3a is being disconnected from the power connector 12a and may need to trigger a discovery procedure to determine the still connected load devices and thus the disconnected load device.

In a yet another embodiment, the one or more load device detectors 7 may be able to detect only that a load device 3a is being disconnected from a particular power connector 12a, and the information what load device it was may be available elsewhere in the system, e.g., in the power supply 2, the commissioning tool 8, the BMS, et cetera. The information about the load device 3a being disconnected can be used to remove the communication information related to this load device (e.g., application level control relationships, group membership, trigger the neighboring load devices to remove the information related to that load device from their internal storages, and re-establish connections which were provided by the removed load device 3a, e.g., a previous child of the removed load device 3a can already search for a new parent, load devices which hat routes leading through the removed load device 3a can re-discover them), update the network configuration (e.g., change the network key to prevent the removed device 3a from re-joining), et cetera. To this end, the one or more load detectors and/or any networked device informed by it of the disconnection, e.g., the power supply 2, the commissioning tool 8 and/or the BMS, can send goodbye messages on behalf of the removed load device 3a, error statuses, and update commands. The information about the load device 3a being disconnected can further be used to disable the power connector 12a to which the removed load device 3a was previously connected, or even switch off the entire power supply 2, if it was the last/only load device powered by it.

In addition, at least some of the commissioning steps can include determining whether the load device 3a is allowed to be connected to the power connector 12a. For instance, if the load device 3a is not allowed in the networked power distribution system 1 (temporarily, during this particular operation mode, e.g., during an emergency or during a power-restricted operation, e.g., as a reaction to a load shedding request of an energy management system, at the specific location, or at all), the commissioning can be abandoned. In addition, information about the "illegal" load device, preferably including its exact location and type, may be forwarded, e.g., to the BMS. Moreover, the commissioning tool 8 can be adapted, if it is determined that the load device 3a is not allowed to be connected to the power connector 12a, to control the networked power distribution system 1 to not provide power to the load device 3a. For instance, it may be possible to remove the power supplied to such "illegal" load device 3a, especially, if the load device 3a is the only one connected to the power connector 12a, as it is the case here, or if it is the last load device in a load device chain.

Moreover, the commissioning tool 8 can be adapted to verify established application level control relationships with regard to a group of load devices 3 and 3a, wherein the verifying includes controlling the group of load devices 3 and 3a, here, the luminaires, via the data communication interface and utilizing an information from the one or more load device detectors 7, wherein the information is indicative of a change of a characteristic related to the supply of power caused by the controlling. For instance, the group of load devices 3 and 3a can be turned on and off via the data communication interface and the corresponding change in the power supplied to the load devices 3 and 3a can be monitored by the one or more load device detectors 7 and then used by the commissioning tool 8 to verify the correctness of the mapping of the load devices 3 and 3a to power supply/power connector and control groups.

Yet further, the commissioning tool 8 can be adapted to perform steps of commissioning the data communication interface with regard to a load device 3a not yet connected to any power connector 12 and 12a and/or physically connected to a power connector, but not supplied with power through it, e.g., because the power connector was unused so far and was therefore deactivated, and, in response thereto, to control the at least one power supply 2 to supply power to a power connector 12a to which no load device 3, 4, 5 or 3a is yet connected, but where the load device 3a should be connected, and/or to control the at least one power supply 2 to supply power to a power connector 12a to which the load device 3a is or likely is connected (which can be determined, e.g., by analyzing the communication information related to the load device 3a, e.g., the load devices in its range, et cetera, or the Ethernet power the device communicates through, et cetera), and/or to activate a load device detector 7. The load device 3a may need to be supplied with power via other means to complete this step, e.g., draw power from a built-in or external battery, be powered via wireless power transfer, et cetera.

In addition, it is possible that a device on the networked power distribution system, e.g., another load device connected to the same power connector or a dedicated load device detector, is capable of detecting at least the fact that a load device is being connected and/or disconnected. Once the connecting of a new load device to the same power connector/power supply is detected, this device uses the data communication interface to contact the new load device and/or the management entity (if any) and triggers the process for providing the required configuration information, e.g., opens itself and/or other devices in the network, preferably in physical proximity to the new load device, for joining, moves to a commissioning channel, shares network key and group membership resp. binding information, et cetera.

Also, it is possible that devices not powered by the networked power distribution system, e.g., battery-powered controllers, such as sensors, or energy-harvesting switches, once commissioned into the network, i.e., once their function and location is known, can be included in the commissioning process happening on the data communication interface, even if the trigger comes from the power system. For the initial commissioning of such devices, the fact of them not being powered by the networked power distribution system, i.e., not resulting in any change on the power drawn, can be also used as a verification of the reported device type/capabilities.

The commissioning process can make use of the connection between communication and power to support the commissioning process. For example, if multiple load devices were connected roughly at the same time (i.e., before configuration of each of them was finalized), the commissioning process could disable the power for particular load devices and observe the effect on the data communication interface (discontinuation of communication from a particular device identifier), re-enable power flow to selected load devices, resulting in resuming communication attempts over the data communication interface, or could use the data communication interface to control the load device (e.g., switch it to its maximum power consumption, switch it on/off, et cetera) and observe the results on the power connection. The same can be applied to the load devices already configured to operate on the networked power distribution system. This way, the connection of one of the multiple load devices to a particular power connector out of the multiple power connectors can be determined. Also, by selectively switching the multiple load devices, the topology of the data communication network (parent/child relationships, use of particular gateway or concentrator) and/or the creation of control relationships (e.g., bindings, groups) can be influenced.

While in the above-described embodiments, the networked power distribution system 1 is a PoE system that utilizes Ethernet for communication, in other embodiments, the networked power distribution system can also be something else, e.g., a DC power bus system, for instance, based on the EMerge 24 V Occupied Space standard or the upcoming EMerge Smart Ceiling Solutions, and the data communication interface can utilize a wire-free communication, like infrared communication, visual light communication, or wireless communication, including ZigBee, Zig-Bee Light Link, ZigBee Building Automation, 802.11/IPv4/IPv6, 6LoWPAN, or any other applicable wireless solution, a DC-based powerline communication (e.g., between the load device and the power connector), any wired communication (e.g., between the power supply and the commissioning tool), or any combination thereof.

In the claims, the word "comprising" does not exclude other elements or steps, and the indefinite article "a" or "an" does not exclude a plurality.

A single unit or device may fulfill the functions of several items recited in the claims. The mere fact that certain measures are recited in mutually different dependent claims does not indicate that a combination of these measures cannot be used to advantage.

Procedures like the detection of the connecting and/or disconnecting of the load device, the commissioning of the power distribution system, et cetera, performed by one or several units or devices, can be performed by any other number of units or devices. These procedures and/or the control of the power distribution system in accordance with the method for commissioning the power distribution system can be implemented as program code means of a computer program and/or as dedicated hardware.

A computer program may be stored/distributed on a suitable medium, such as an optical storage medium or a solid-state medium, supplied together with or as part of other hardware, but may also be distributed in other forms, such as via the Internet or other wired or wireless telecommunication systems.

Any reference signs in the claims should not be construed as limiting the scope.

The invention claimed is:

1. A support system for supporting the commissioning of a networked power distribution system for supplying power to and exchanging communication data with a plurality of load devices, the networked power distribution system comprising at least one power supply with one or more power connectors for supplying power to the one or more power connectors and a data communication interface for exchanging communication data with the plurality of load devices, wherein the support system comprises:
one or more load device detectors for detecting the connecting and/or disconnecting of a load device of the plurality of load devices to or from a power connector of the one or more power connectors, and
a processor configured to perform steps of commissioning the networked power distribution system with regard to the load device,
wherein the processor is adapted to automatically perform at least some of the commissioning steps in response to the detection of the connecting and/or disconnecting of the load device,
wherein the one or more load device detectors are adapted to generate an information indicative of one or more of (i) the connecting and (ii) the disconnecting, wherein the processor is adapted to utilize the information in performing the at least some of the commissioning steps,
wherein the information includes a power connector information indicative of the power connector to which or from which the load device is being connected or disconnected and/or a power supply information indicative of the power supply supplying the power thereto, wherein the power connector information and/or the power supply information represent information about the location of the load device in the networked power distribution system and the at least some of the commissioning take into consideration the location information,
wherein, when the plurality of load devices are connected to the one or more power connectors, the processor is configured to establish application level control relationships between the plurality of load devices and one or more user interface elements based on the location information, such that the one or more application level control relationships enable the one or more user interface elements to concurrently control the plurality of load devices.

2. The support system as defined in claim 1, wherein the one or more load device detectors are adapted to detect the connecting and/or disconnecting of the load device based on one or more of (i) monitoring a change of a characteristic related to the supply of power, (ii) a power negotiation process performed between the at least one power supply and the load device, and (iii) a mechanical process.

3. The support system as defined in claim 1, wherein the at least some of the commissioning steps include steps of commissioning the data communication interface with regard to the load device.

4. The support system as defined in claim 1, wherein the one or more load device detectors are further adapted to generate an information indicative of a characteristic of the load device, indicative of the type thereof, wherein the processor is adapted to utilize the information in performing the at least some of the commissioning steps.

5. The support system as defined in claim 1, wherein, if multiple load devices of the plurality of load devices are connected to a power connector of the one or more power connectors and a load device of the multiple load devices is disconnected from the power connector, the information includes one or more of (i) a load device identity information indicative of the identity of the load device being disconnected, (ii) a characteristic of the load device indicative of the type of the load device is being disconnected, (iii) a power connector information indicative of the power connector of the one or more power connectors from which the load device is being disconnected, and (iv) a power supply information indicative of the power supply supplying the power thereto.

6. The support system as defined in claim 4, wherein generating the information indicative of a characteristic of the load device includes performing a training procedure on the load device, wherein the training procedure includes controlling the at least one power supply to supply a characteristic power to the power connector to which the load device is connected and/or controlling the load device in a characteristic manner via the data communication interface.

7. The support system as defined in claim 1, wherein the at least some of the commissioning steps include determining whether the load device is allowed to be connected to the power connector of the one or more power connectors.

8. The support system as defined in claim 7, wherein the processor is adapted, if it is determined that the load device is not allowed to be connected to the power connector, to control the networked power distribution system to not provide power to the load device.

9. The support system as defined in claim 1, wherein the at least some of the commissioning steps include steps of establishing application level control relationships with regard to the load device.

10. The support system as defined in claim 1, wherein the processor is adapted to verify established application level control relationships with regard to a group of load devices of the plurality of load devices, wherein the verifying includes controlling the group of load devices via the data communication interface and utilizing an information from the one or more load device detectors, wherein the information is indicative of a change of a characteristic related to the supply of power caused by the controlling.

11. The support system as defined in claim 1, wherein the processor is adapted to perform steps of commissioning the data communication interface with regard to a load device of the plurality of load devices not yet powered by any power connector and, in response thereto, to control the at least one power supply to supply power to a power connector to which the load device is connected and/or to supply power to a power connector to which no load device is yet connected and/or to activate a load device detector of the one or more load device detectors.

12. A networked power distribution system for supplying power to and exchanging communication data with the plurality of load devices, wherein the networked power distribution system comprises:
   at least one power supply with one or more power connectors for supplying power to the one or more power connectors,
   a data communication interface for exchanging communication data with the plurality of load devices,
   the support system as defined in claim 1 for supporting the commissioning of the networked power distribution system.

13. A support method for supporting the commissioning of a networked power distribution system for supplying power to and exchanging communication data with a plurality of load devices, the networked power distribution system comprising at least one power supply with one or more power connectors for supplying power to the one or more power connectors and a data communication interface for exchanging communication data with the plurality of load devices, wherein the support method comprises:
   detecting the connecting and/or disconnecting of a load device of the plurality of load devices to or from a power connector of the one or more power connectors, by one or more load device detectors, and
   performing steps of commissioning the networked power distribution system with regard to the load device, by a processor,
   wherein at least some of the commissioning steps are automatically performed in response to the detection of the connecting and/or disconnecting of the load device,
   wherein the one or more load device detectors generate an information indicative of one or more of (i) the connecting and (ii) the disconnecting, wherein the processor utilizes the information in performing the at least some of the commissioning steps,
   wherein the information includes a power connector information indicative of the power connector to which or from which the load device is being connected and/or disconnected and/or a power supply information indicative of the power supply supplying the power thereto, wherein the power connector information and/or the power supply information represent information about the location of the load device in the networked power distribution system and the at least some of the commissioning take into consideration the location information,
   wherein, when the plurality of load devices are connected to the one or more power connectors, the processor is configured to establish one or more application level control relationships between the plurality of connected load devices and one or more user interface elements based on the location information, wherein such that the one or more application level control relationships enable the one or more user interface elements to concurrently control the plurality of load devices.

14. A computer program for controlling a support system for supporting the commissioning of a networked power distribution system for supplying power to and exchanging communication data with a plurality of load devices, wherein the computer program comprises program code configured to:
   detect the connecting and/or disconnecting of a load device of the plurality of load devices to or from a power connector of one or more power connectors, by one or more load device detectors, and
   perform steps of commissioning the networked power distribution system with regard to the load device, by a processor,
   wherein at least some of the commissioning steps are automatically performed in response to the detection of the connecting and/or disconnecting of the load device,
   wherein the one or more load device detectors generate an information indicative of one or more of (i) the connecting and (ii) the disconnecting, wherein the processor utilizes the information in performing the at least some of the commissioning steps,
   wherein the information includes a power connector information indicative of the power connector to which or from which the load device is being connected or disconnected and/or a power supply information indicative of the power supply supplying the power thereto, wherein the power connector information and/or the power supply information represent information about the location of the load device in the networked power distribution system and the at least some of the commissioning take into consideration the location information,
   wherein, when the plurality of load devices are connected to the one or more power connectors, the processor is configured to establish one or more application level control relationships between the plurality of connected load devices and one or more user interface elements based on the location information, such that the one or more application level control relationships enable the one or more user interface elements to concurrently control the plurality of connected load devices.

* * * * *